United States Patent [19]

Voorman et al.

[11] Patent Number: 4,747,068

[45] Date of Patent: May 24, 1988

[54] ADAPTIVE FILTER

[75] Inventors: Johannes O. Voorman; Louis J. van Mal, both of Eindhoven, Netherlands

[73] Assignee: U.S. Philips Corporation, New York, N.Y.

[21] Appl. No.: 918,171

[22] Filed: Oct. 10, 1986

[30] Foreign Application Priority Data

Oct. 10, 1985 [NL] Netherlands ............................ 8502767

[51] Int. Cl.$^4$ .......................... G06F 7/38; H03H 21/00
[52] U.S. Cl. ....................................... 364/724; 333/18; 375/14
[58] Field of Search ........................ 364/724, 726, 825; 333/18, 166; 375/11–14

[56] References Cited

U.S. PATENT DOCUMENTS

| | | | |
|---|---|---|---|
| 3,597,541 | 12/1969 | Proakis et al. | 333/18 |
| 3,736,414 | 5/1973 | McAuliffe | 364/724 |
| 3,781,720 | 12/1973 | Mueller | 333/18 |
| 3,978,435 | 8/1976 | Luvison et al. | 333/18 |
| 4,013,980 | 3/1977 | Schollmeier | 333/18 |
| 4,184,129 | 1/1980 | Macchi nee Danjon et al. | 333/18 |
| 4,290,139 | 9/1981 | Walsh | 375/14 |
| 4,322,811 | 3/1982 | Voorman | 364/825 |
| 4,333,158 | 6/1982 | Voorman | 364/825 |
| 4,695,969 | 9/1987 | Sollenberger | 364/724 |

Primary Examiner—Gary V. Harkcom
Assistant Examiner—Tan V. Mai
Attorney, Agent, or Firm—Gregory P. Gadson

[57] ABSTRACT

In an adaptive filter a plurality of outputs (5, 7, 9, 11) of a delay circuit (3) are coupled via coefficient control circuits (21, 23, 25, 27) to a plurality of inputs (91, 93, 95, 97) of an adder circuit (89). The control signal inputs (29, 31, 33, 35) of the coefficient control circuits each receive a control signal via first integrators (37, 39, 41, 43) from first multiplier circuits (53, 55, 57, 59). A further output (85) of the delay circuit (3) controls a further input (87) of the adder circuit (89). The output signal from the adder circuit is controlled by a control circuit (121) which receives a control signal from a second multiplier circuit (103) via a second integrator (109) and a circuit having an exponential transfer function (113). A convergence behavior of the adaptive filter which is virtually independent of signal amplitudes is obtained by driving the integrators in such a way that the amplitude of their input signals are substantially independent of the amplitude of the signal at the input (1) of the filter (FIG. 1).

1 Claim, 5 Drawing Sheets

ADAPTIVE FILTER

The invention relates to an adaptive filter comprising a delay circuit having an input for a signal to be filtered and a plurality of outputs, each coupled to a respective coefficient control circuit, an output of which is coupled to an adder circuit and a control signal input of which is coupled to an output of a respective first integrator, an input of which is coupled to an output of a respective first multiplier circuit, an input of said first multiplier circuit being coupled to the relevant output of the delay circuit and a further input thereof being coupled to an output of a correction signal generating circuit, an input of which is coupled to an output of the adder circuit, the signal at the said input of the correction signal generating circuit being controllable by means of a control circuit having a control signal input which is coupled to an output of a second integrator, an input of which is coupled to an output of a second multiplier circuit, an input of said second multiplier circuit being coupled to an output of the correction signal generating circuit.

An adaptive filter of the type described above is known from Netherlands patent application No. 7902093 (PHN 9388)—particularly page 7, lines 3-8—in which the control circuit is a divider circuit, and further inputs of the correction signal generating circuit and of the second multiplier circuit receive a reference signal, and the output signal from the correction signal generating circuit is applied to an input of the second multiplier circuit via a multiplier circuit which is also controlled by the output signal from the second integrator.

SUMMARY OF THE INVENTION

It is an object of the invention to improve the convergence behavior of an adaptive filter.

To this end, an adaptive filter of the type described in the opening paragraph according to the invention is characterized in that the control circuit is a third multiplier circuit, in that a further input of the second multiplier circuit is coupled to a further output of the delay circuit, and in that the output of the second integrator is coupled to the control signal input of the third multiplier circuit via a circuit having a substantially exponential transfer characteristic.

Due to the measures according to the invention it is achieved that the input signals from the integrators are kept as constant as possible. In the known circuit these signals were found to vary quadratically with the amplitude of the signal at the input of the filter. As a result the convergence rate was slow and filter adjustment was inaccurate at a small signal amplitude, while the filter adjustment could become unstable at a large signal amplitude.

It is now possible to obtain from the filter an output signal of a constant amplitude which is suitable to be further filtered, if desired, via a recursive adaptive filter.

An adaptive filter according to the invention may be used, for example, for correcting the transfer characteristic of a data signal transmission path as in, for example, a teletext receiver.

The correction signal generating circuit may comprise, for example, a circuit having a three-level sign-changing function as is described in Netherlands patent application No. 8402071 (PHN 11 077) or a difference-determining circuit which receives a reference signal at a further input, which signal can be obtained by means of symmetrical limitation from an output signal of the filter for given filter functions, whilst for other filter functions the filter may have a further input for this reference signal.

DESCRIPTION OF THE DRAWINGS

The invention will now be described in detail with reference to the drawings.

In the drawings.

DETAILED DESCRIPTION

Figure 1:
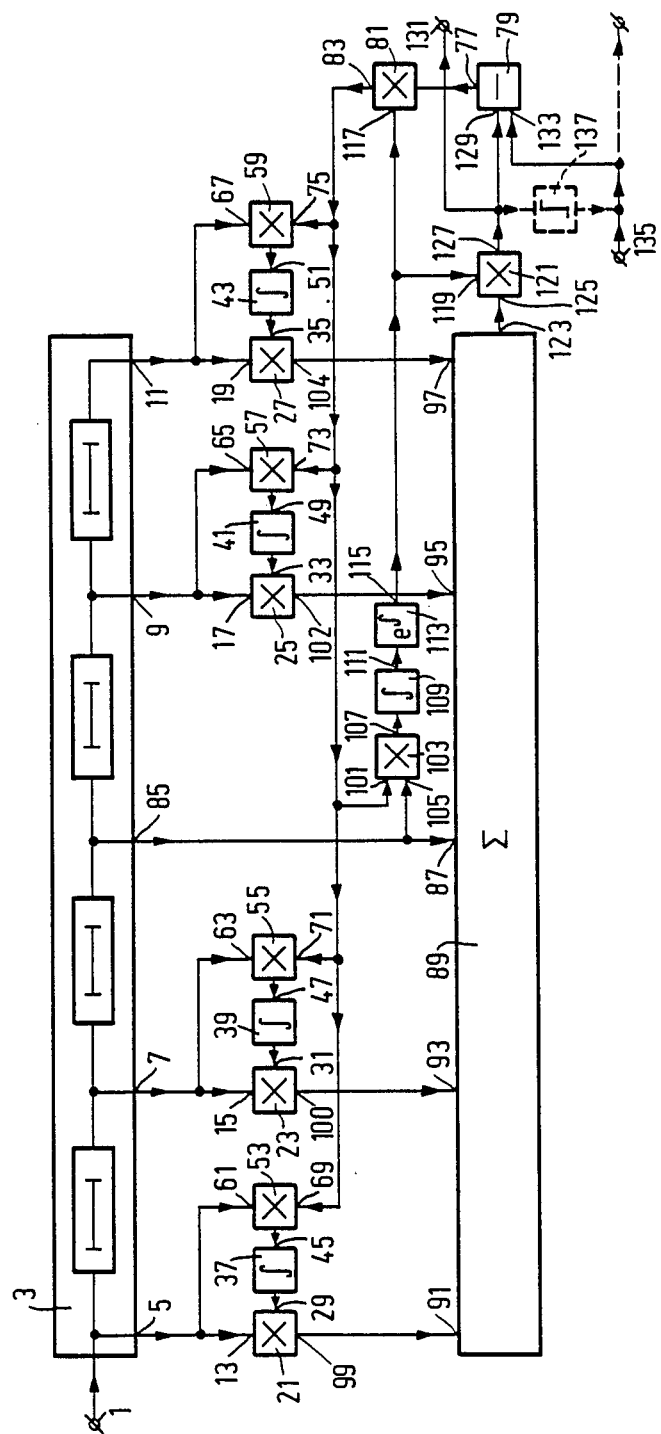
FIG. 1 shows by way of a simplified block diagram a first possible embodiment of an adaptive filter according to the invention.

In FIG. 1 a signal to be filtered is applied to an input 1 of the adaptive filter, which is also the input of a delay circuit 3. A plurality of outputs 5, 7, 9, 11 of the delay circuit are connected to inputs 13, 15, 17, 19 of coefficient control circuits 21, 23, 25, 27, respectively, control signal inputs 29, 31, 33, 35 of which are connected to outputs of first integrators 37, 39, 41, 43, respectively.

Inputs 45, 47, 49, 51 of the first integrators 37, 39, 41, 43 are connected to outputs of first multiplier circuits 53, 55, 57, 59, respectively, inputs 61, 63, 65, 67 of which are connected to the relevant outputs 5, 7, 9, 11, respectively of the delay circuit 3.

Further inputs 69, 71, 73, 75 of the first multiplier circuits 53, 55, 57, 59 receive a correction signal whose amplitude is controllable by means of a multiplier 81 from an output 77 of a correction signal generating circuit 79 via the multiplier 81, an output 83 of which is connected to the inputs 69, 71, 73, 75, respectively.

Furthermore, the delay circuit 3 has an output 85 which is connected to an input 87 of an adder circuit 89, further inputs 91, 93, 95, 97 of which are connected to outputs 99, 100, 102, 104 of the coefficient control circuits 21, 23, 25, 27, respectively.

The output 83 of the multiplier 81 is also connected to an input 101 of a second multiplier circuit 103, a further input 105 of which is connected to the further output 85 of the delay circuit 3.

An output 107 of the second multiplier circuit 103 is connected to the input of a second integrator 109, an output 111 of which is connected to the input of a circuit 113 having an exponential transfer function, an output 115 of which is connected to a control signal input 117 of the multiplier 81 and a control signal input 119 of a third multiplier circuit 121 operating as a control circuit.

An output 123 of the adder circuit 89 is connected to a further input 125 of the third multiplier circuit 121, an output 127 of which is connected to an input 129 of the multiplier 81 and to an output 131 of the filter.

A further input 133 of the correction signal generating circuit 79, which is formed as a difference-determining circuit in this embodiment, is connected to a reference signal input 135 of the filter, or it may be connected to the output 131 of the filter via a limiter 137 for given functions of the filter.

The principle of the operation of an adaptive filter has extensively been described in IEEE Transactions on Consumer Electronics, Vol. CE 27, No. 3, August 1981, pages 512–529, and in Netherlands patent application No. 7902093 (PHN 9388) as has a plurality of detail circuits which may also be used in the embodiment of FIG. 1.

The difference between the circuit of FIG. 1 and that of the said publications is that when designating the correction signal to be c and the control signal at the control signal input of the third multiplier circuit to be a, both the first integrators and the second integrator receive a signal a c x in this case, wherein x is the signal at a relevant branch 5, 7, 9, 11 or 85 of the delay circuit 3 while furthermore a is made to be ke/due to the circuit 113 having the exponential transfer function, wherein k is a constant which is determined by the gain in the relevant loop. As a result the input signals of the first and second integrators appear to have an amplitude which is substantially independent of the amplitude of the input signal from the filter, so that the loop gain remain substantially constant and hysteresis phenomena and instabilities due to overdrive do not occur and the convergence rate of the filter becomes virtually independent of the signal amplitude. The factor k may therefore be chosen to be just slightly below the value at which an instability would occur. The convergence rate is then as large as possible.

If desired, a circuit which produces a sign change of its output signal at three levels of the input signal, as described in Netherlands patent application No. 8402071 (PHN 11077), may be used for generating the correction signal instead of the difference-determining circuit 79.

The position of the output 85 of the delay circuit 3 to which no coefficient control circuit is connected may be chosen arbitrarily.

It will be evident that further d.c. level control circuits and circuits for eliminating blocked states can be used, for example, as described in the above cited literature, and that the integrators may be driven intermittently, if desired.

Figure 2:
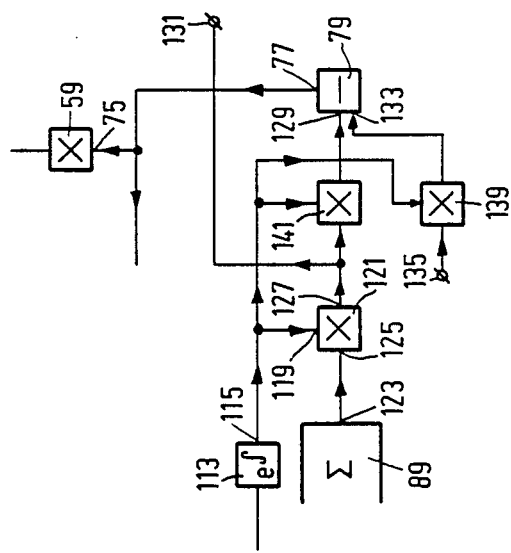
FIG. 2 shows by way of a block diagram a possible further embodiment of part of an adaptive filter according to FIG. 1.

FIG. 2 in which components corresponding to those in FIG. 1 have the same reference numerals, shows how the function of the multiplier 81 of FIG. 1 may be carried out, if desired, by two multipliers 139 and 141 arranged between the input 133 of the correction signal generating circuit 79 formed as a difference-determining circuit and the reference signal input 135, and between the input 129 of the difference-determining circuit 79 and the output 127 of the third multiplier circuit 121, respectively, which multipliers furthermore receive the output signal from the circuit 113. The output 77 of the difference-determining circuit 79 is now directly connected to the inputs 75, 73, 71, 69 of the first multiplier circuits 59, 57, 55, 53, respectively, and to the input 101 of the second multiplier circuit 103.

Figure 3:
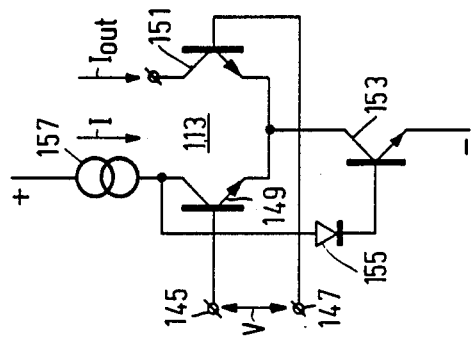
FIG. 3 shows by way of a simplified diagram a possible embodiment of a circuit having a substantially exponential transfer function for an adaptive filter according to the invention.

In FIG. 3 two terminals 145 and 147 of an input of the circuit 113 having an exponential transfer function are connected to the bases of transistors 149 and 151, respectively, whose emitters are connected together and are connected to the collector of a transistor 153. The base of the transistor 153 is connected via a diode 155 to the collector of the transistor 149 which receives a current I from a current source 157. The collector of the transistor 151 draws a current $I_{out}$ which is exponentially dependent on voltage V between the terminals 145 and 147. This is evident as follows.

The current through the diode 155 is assumed to be negligibly small relative to I. The base emitter voltage of the transistor 149 is denoted $V_1$ and that of transistor 151 is denoted $V_2$.

In that case $$I = I_o\, e^{\frac{qV_1}{kT}} \text{ and}$$

$$I_{out} = I_o\, e^{\frac{qV_2}{kT}}$$

$$\frac{I_{out}}{I} = e^{\frac{q}{kT}(V_2 - V_1)} = e^{\frac{qV}{kT}}$$

when the same value for $I_o$ is assumed for the two transistors 149, 151, which value can be obtained by using equal dimensions of these transistors. Consequently $$I_{out} = I\, e^{\frac{qV}{kT}}$$

so that the output current $I_{out}$ of the circuit 113 depends exponentially on the input voltage V.

Figure 4:
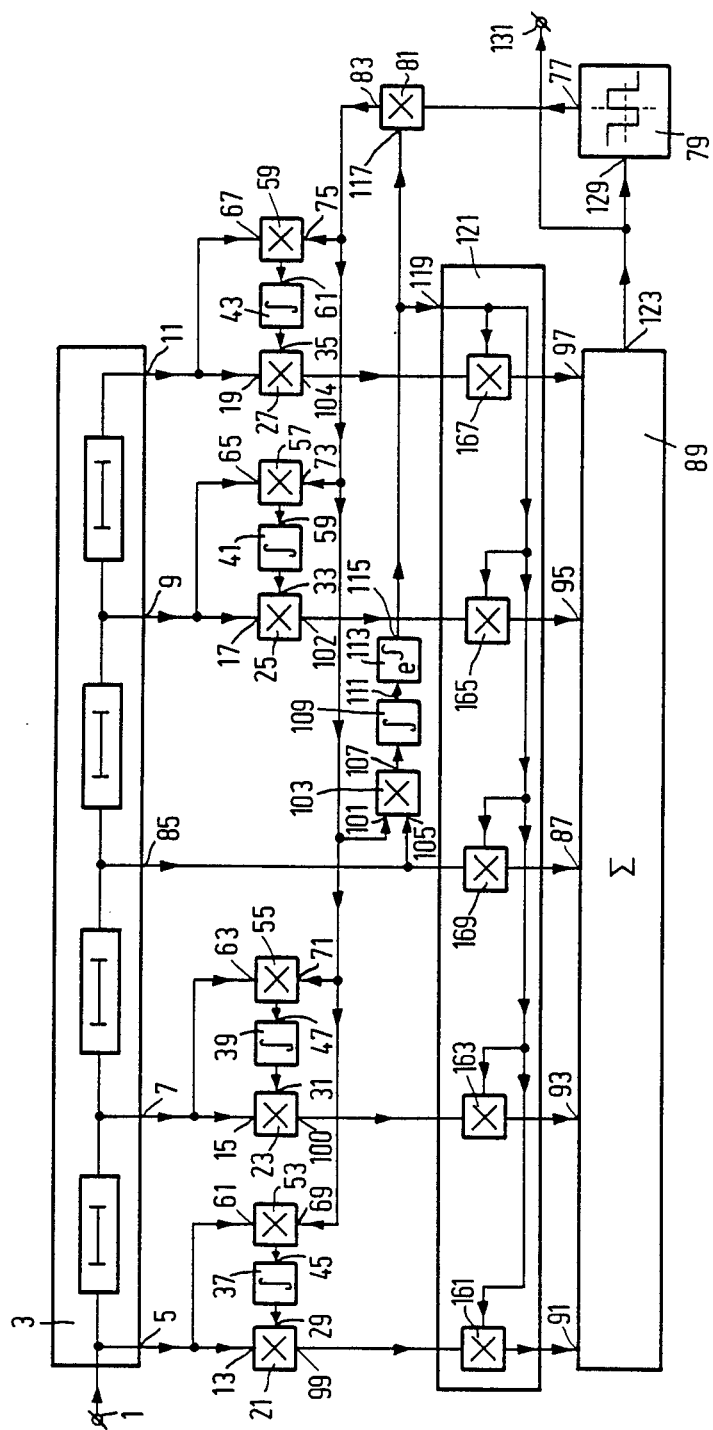
FIG. 4 shows by way of a simplified block diagram a second possible embodiment of an adaptive filter according to the invention.

In FIG. 4 the same reference numerals as those of the previous Figures have been used for corresponding elements.

The correction signal generating circuit 79 is shown in this case by way of example as a three-level sign-changing circuit, but it may be alternatively formed as a difference-determining circuit succeeded or not succeeded by a limiter.

The third multiplier circuit 121 is not incorporated at the output of the adder circuit 89 as in FIG. 1, but in its input circuit and comprises four multipliers 161, 163, 165, 167 incorporated between the outputs 99, 100, 102, 104 of the coefficient control circuits 21, 23, 25, 27, respectively, and a multiplier 169 incorporated between the output 85 of the delay circuit 3 and the input 87 of the adder circuit 89. The further inputs of the multipliers 161, 163, 165, 167, 169 are connected to the control signal input 119 of the third multiplier circuit 121.

Figure 5:
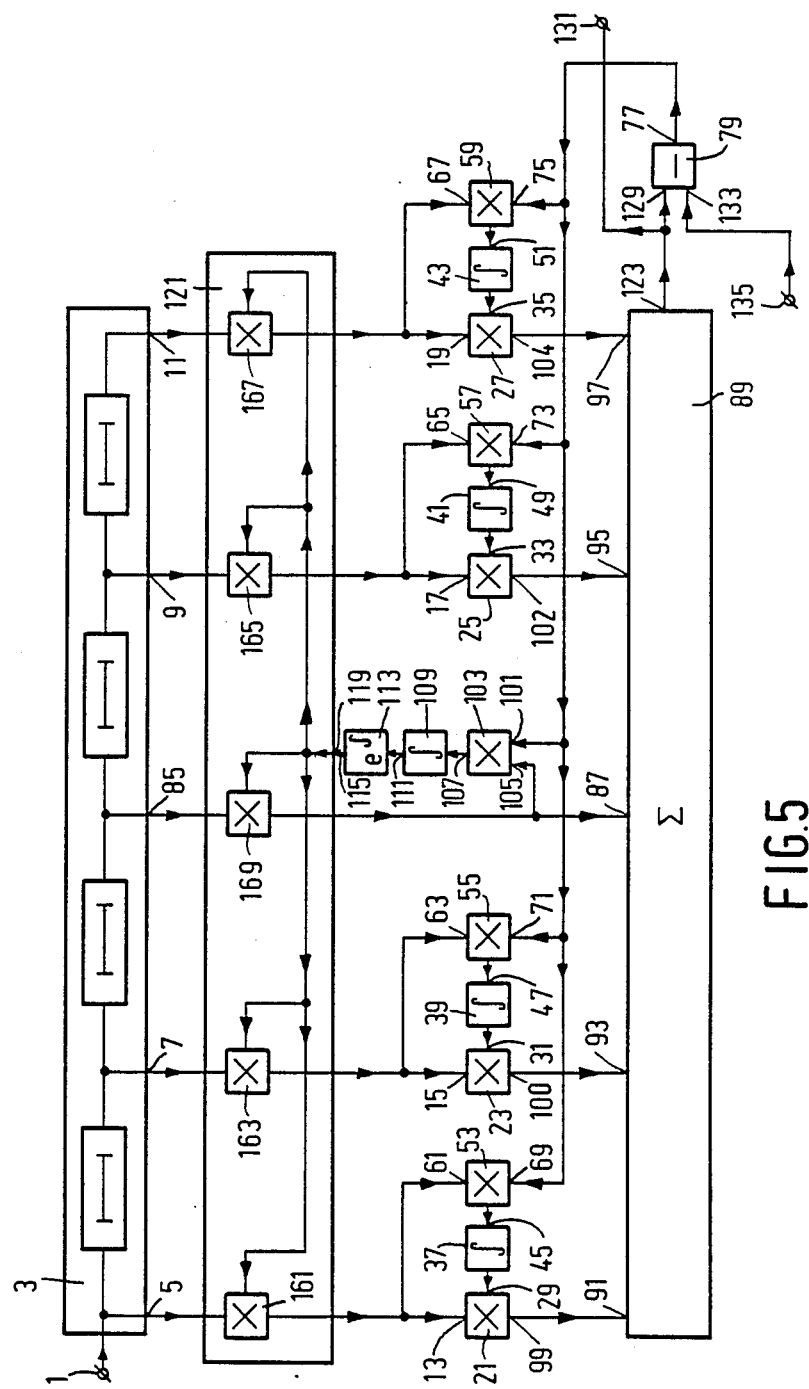
FIG. 5 shows by way of a simplified block diagram a third possible embodiment of an adaptive filter according to the invention.

When, as is shown in FIG. 5, the third multiplier circuit 121 is connected to the outputs 5, 7, 85, 9, 11 of the delay circuit 3, then this third multiplier circuit also fulfills the function of the multiplier 81 shown in the previous Figures so that this latter multiplier is omitted. Corresponding elements have the same reference numerals as those in the previous Figures.

The input 101 of the second multiplier circuit 103 is now connected to the output 77 of the correction signal generating circuit 79 and likewise are the inputs 69, 71, 73 and 75 of the first multiplier circuits 53, 55, 57 and 59, respectively.

The multipliers 161, 163, 165, 167 are now incorporated between the outputs 5, 7, 9, 11, respectively, of the delay circuit 3 and the inputs 13 and 61, 15 and 63, 17 and 65, 19 and 67, respectively, of the coefficient control circuit 21 and the first multiplier circuits 53, 23, and 55, 25 and 57, 27 and 59, respectively. The multiplier 169 is incorporated between the output 85 of the delay circuit 3 and the input 87 of the adder circuit 89 which is connected to the input 105 of the second multiplier circuit 103.

Figure 6:
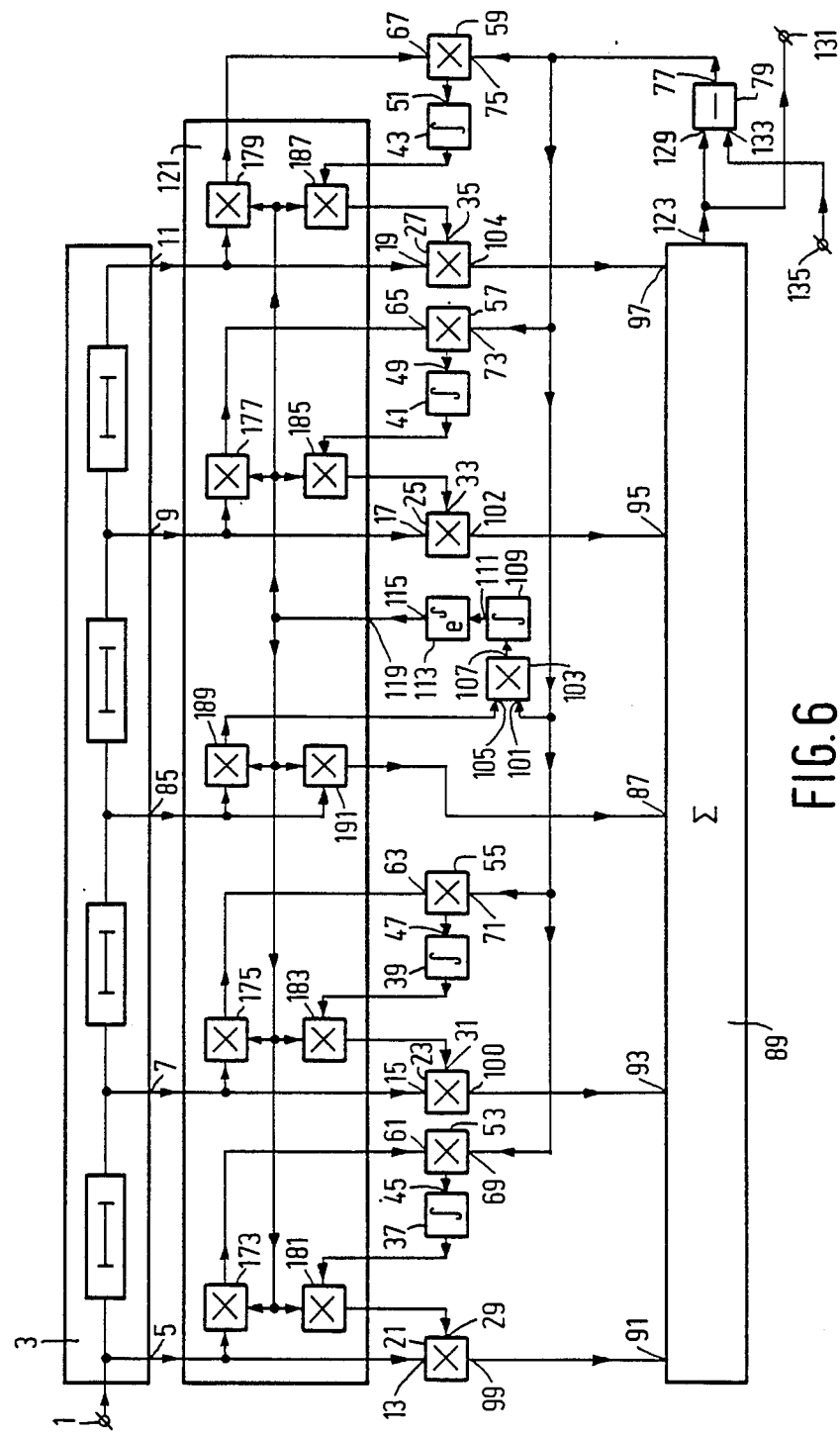
FIG. 6 shows by way of a simplified block diagram a fourth possible embodiment of an adaptive filter according to the invention.

FIG. 6 shows a variant of the circuit of FIG. 5. Again the same reference numerals as those in the previous Figures have been used for corresponding elements. In this case the multiplier circuit 121 comprises ten multipliers 173, 175, 177, 179, 181, 183, 185, 187, 189 and 191.

The multipliers 173, 175, 177 and 179 are incorporated between the outputs 5, 7, 9, 11, respectively, of the delay circuit 3 and the inputs 61, 63, 65, 67 of the first multiplier circuits 53, 55, 57, 59, respectively. The multipliers 181, 183, 185, 187 are incorporated between the outputs of the integrators 37, 39, 41, 43, respectively, and the control signal inputs 29, 31, 33, 35 of the coefficient control circuits 21, 23, 25, 27, respectively. The multiplier 189 is connected between the output 85 of the delay circuit 3 and the input 105 of the second multiplier circuit 103 and the multiplier 101 is incorporated between the output 85 of the delay circuit 3 and the input 87 of the adder circuit 89. All of the ten multipliers 173, 175, 177, 179, 181, 183, 185, 187, 189, 191 further have an input which is connected to the control signal input 119 of the third multiplier circuit 121.

What is claimed is:

1. An adaptive filter comprising:
    a delay circuit having a plurality of outputs, for delaying an input signal to be filtered;
    a plurality of coefficient control circuits coupled to the outputs of said delay circuit;
    an adder circuit coupled at its inputs to the outputs of said coefficient control circuits;
    a plurality of first integrator circuits, the output of each being coupled to an input of a corresponding coefficient control circuit;
    a plurality of first multiplier circuits, the output of each being coupled to the input of a corresponding first integrtor circuit, and each having one of its inputs coupled to an output of said delay circuit;
    a correction signal generating circuit coupled at its output to an input of each first multiplier circuit;
    a second multiplier circuit coupled at one input to an output of said delay circuit and coupled at another input to the output of said correction signal generating circuit;
    a second integrator circuit coupled at its input to the output of said second multiplier circuit;
    a third multiplier circuit having a substantially exponential transfer characteristic, the input of said third multiplier circuit being coupled to the output of said second integrator circuit; and
    a control signal multiplier circuit for sending control signals from its output to an input of said correction signal generating circuit, said control signal multiplier circuit being coupled at one of its inputs to the output of said adder circuit, and said control signal multiplier circuit being coupled at another of its inputs to an output of said third multiplier circuit.

* * * * *